(12) United States Patent
Eri et al.

(10) Patent No.: US 8,102,026 B2
(45) Date of Patent: Jan. 24, 2012

(54) GROUP-III NITRIDE SEMICONDUCTOR FREESTANDING SUBSTRATE AND MANUFACTURING METHOD OF THE SAME

(75) Inventors: Takeshi Eri, Hitachi (JP); Takeshi Meguro, Kitaibaraki (JP)

(73) Assignee: Hitachi Cable, Ltd., Tokyo (JP)

( * ) Notice: Subject to any disclaimer, the term of this patent is extended or adjusted under 35 U.S.C. 154(b) by 293 days.

(21) Appl. No.: 12/556,635

(22) Filed: Sep. 10, 2009

(65) Prior Publication Data

US 2010/0258812 A1 Oct. 14, 2010

(30) Foreign Application Priority Data

Apr. 13, 2009 (JP) .................................. 2009-97255

(51) Int. Cl.
*H01L 29/20* (2006.01)
(52) U.S. Cl. ......... 257/615; 257/E29.089; 257/E21.135; 438/495; 438/505; 438/508
(58) Field of Classification Search .................. 257/615, 257/E29.089, E29.093, E21.135; 438/478, 438/495, 499, 501, 505, 508
See application file for complete search history.

(56) References Cited

U.S. PATENT DOCUMENTS

| | | | |
|---|---|---|---|
| 6,765,240 B2 * | 7/2004 | Tischler et al. | ............... 257/183 |
| 6,924,159 B2 | 8/2005 | Usui et al. | |
| 7,271,404 B2 * | 9/2007 | Oshima et al. | ................... 257/11 |
| 7,288,830 B2 * | 10/2007 | Shibata | ......................... 257/615 |
| 2002/0197825 A1 | 12/2002 | Usui et al. | |
| 2006/0226414 A1 * | 10/2006 | Oshima | ............................ 257/11 |
| 2007/0148920 A1 * | 6/2007 | Kasai et al. | ................... 438/478 |
| 2007/0176199 A1 * | 8/2007 | Shibata | ......................... 257/103 |
| 2007/0246733 A1 * | 10/2007 | Oshima | ......................... 257/103 |
| 2009/0026417 A1 * | 1/2009 | Fujita | ..................... 252/301.4 R |
| 2010/0164070 A1 * | 7/2010 | Okahisa et al. | ............... 257/615 |
| 2010/0200955 A1 * | 8/2010 | Oshima | ......................... 257/615 |
| 2010/0270649 A1 * | 10/2010 | Ishibashi et al. | .............. 257/615 |

FOREIGN PATENT DOCUMENTS

| | | |
|---|---|---|
| JP | 2000-44400 A | 2/2000 |
| JP | 2000-91234 A | 3/2000 |
| JP | 2003-178984 A | 6/2003 |

* cited by examiner

*Primary Examiner* — Allan R Wilson
(74) *Attorney, Agent, or Firm* — Martin Fleit; Paul D. Bianco; Fleit Gibbons Gutman Bongini & Bianco PL (57) ABSTRACT

To provide a group-III nitride semiconductor freestanding substrate, with carrier concentration of a peripheral part of a n-type group-III nitride semiconductor freestanding substrate set to be lower than the carrier concentration inside of the peripheral part. In this freestanding substrate, preferably value $\Delta\sigma$ obtained by dividing a difference between a maximum value of the carrier concentration and a minimum value of the carrier concentration in a surface of the freestanding substrate by the maximum value of the carrier concentration is greater than 0.05, and the carrier concentration in any place in the surface of the freestanding substrate exceeds $5.0 \times 10^{17}$ cm$^{-3}$.

10 Claims, 5 Drawing Sheets

| FLOW RATE CONDITION OF CARRIER GAS | POSITION FROM SUBSTRATE CENTER (mm) AND GROWING THICKNESS ($\mu$m) | | | | | | | | | | |
|---|---|---|---|---|---|---|---|---|---|---|---|
| | -25 | -20 | -15 | -10 | -5 | 0 (CENTER) | 5 | 10 | 15 | 20 | 25 |
| FLOW RATE CONDITION 1 | 189.6 | 186 | 184.6 | 181 | 176 | 170.4 | 165.4 | 159 | 154.7 | 152 | 148 |
| FLOW RATE CONDITION 2 (INCREASE OF FLOW RATE) | 150.2 | 158.8 | 161.6 | 167.3 | 170.1 | 173 | 178.7 | 183.2 | 184 | 173 | 157.8 |

| DOPING | KIND (CHANGED CONDITION) | PRESENCE /ABSENCE OF CRACK | WARPAGE OF SUBSTRATE ($\mu m$) | POSITION FROM SUBSTRATE CENTER (mm) AND CARRIER CONCENTRATION ($\times 10^{18} cm^{-3}$) | | | | | |
|---|---|---|---|---|---|---|---|---|---|
| | | | | 0mm | 5mm | 10mm | 15mm | 20mm | 25mm |
| UNDOPE | COMPARATIVE EXAMPLE 1 | PRESENCE | 93 | 0.525 | 0.525 | 0.520 | 0.519 | 0.509 | 0.5 |
| n-DOPE | COMPARATIVE EXAMPLE 2 | PRESENCE | 93 | 1.25 | 1.25 | 1.24 | 1.23 | 1.21 | 1.19 |
| n-DOPE | EXAMPLE 1 (HEIGHT OF SUBSTRATE HOLDER) | ABSENCE | 72 | 1.25 | 1.24 | 1.22 | 1.20 | 1.17 | 1.09 |
| n-DOPE | EXAMPLE 2 (FLOW RATE OF PURGE GAS) | ABSENCE | 65 | 1.25 | 1.24 | 1.22 | 1.19 | 1.14 | 1.03 |
| n-DOPE | EXAMPEL 3 (FLOW RATE OF CARRIER GAS) | ABSENCE | 67 | 1.19 | 1.20 | 1.23 | 1.27 | 1.22 | 1.08 |

| DOPING | KIND (CHANGED CONDITION) | MAXIMUM VARIATION $\Delta \sigma$ OF CARRIER CONCENTRATION | REDUCTION AMOUNT OF WARPAGE($\mu$m) |
|---|---|---|---|
| UNDOPE | COMPARATIVE EXAMPLE 1 | 0.05 | 0 |
| n-DOPE | COMPARATIVE EXAMPLE 2 | 0.05 | 0 |
| | EXAMPLE 1(HEIGHT OF SUBSTRATE HOLDER) | 0.13 | 21 |
| | EXAMPLE 2(FLOW RATE OF PURGE GAS) | 0.18 | 28 |
| | EXAMPLE 3(FLOW RATE OF CARRIER GAS) | 0.15 | 26 |

GROUP-III NITRIDE SEMICONDUCTOR FREESTANDING SUBSTRATE AND MANUFACTURING METHOD OF THE SAME

BACKGROUND

1. Technical Field

The present invention relates to a group-III nitride semiconductor freestanding substrate such as a GaN freestanding substrate, and a manufacturing method of the same, and particularly relates to the group-III nitride semiconductor freestanding substrate capable of reducing warpage of the freestanding substrate.

2. Description of Related Art

A group-III nitride semiconductor material has a sufficiently wide energy band gap, and an interband transition is a direct transition, and therefore it has been actively developed so as to be applied to a short wavelength light emitting element. In addition, a saturated electron drift velocity is fast, and two dimensional carrier gas by hetero junction can be used. Therefore application to an electron element is also expected.

As a method of obtaining the group-III nitride semiconductor freestanding substrate with relatively less crystal defects, it is possible to use a method such as that a heterogeneous substrate (foreign substrate) like a sapphire substrate is set as a base substrate, then a GaN crystal is epitaxially-grown thick on this base substrate by using a hydride vapor phase epitaxy (HVPE method) in which a crystal growing speed is fast, and after end of the growth, the base substrate is removed by a certain method, to thereby use the remained GaN crystal layer as a GaN freestanding substrate.

For example, a mask having an opening part is formed on the base substrate like a sapphire substrate, and by using a technique of obtaining a GaN layer with few dislocations by making the GaN layer lateral-grown from the opening part, namely, a so-called ELO (Epitaxial Lateral Overgrowth) technique, the GaN layer is formed on the sapphire substrate, and thereafter the sapphire substrate is removed by etching, etc, to thereby obtain the GaN freestanding substrate.

Also, a DEEP (Dislocation Elimination by the Epi-growth with Inverted-Pyramidal Pits) method is a method of removing a GaAs substrate by a method such as etching, after the GaN layer is grown by using the mask such as silicon nitride patterned on the GaAs substrate.

Further, according to a VAS (Void-Assisted Separation) method, the GaN layer is grown, with a void layer interposed between the sapphire substrate and the GaN layer, and the GaN layer is separated at a boundary of the void layer after end of the growth (for example, see patent document 1).

As the GaN substrate used in fabricating the light emitting element, a conductive substrate is normally used for the purpose of fabricating a light emitting device having an upper/lower electrode structure in which an electrode (upper electrode) is provided in an upper part of epitaxial layers formed on the surface of the GaN substrate, and also an electrode (lower electrode) is provided on a rear surface of the GaN substrate. n-type is frequently used in a conductive type of the GaN substrate. This is because p-type conductivity can not be obtained if thermal processing and activation by electron beam irradiation are not performed, after GaN is crystal-grown, with Mg doped thereinto. Therefore, n-type is used as the conductive type of the GaN substrate, and a device structure is designed in such a manner that an outermost layer of epitaxial layers structure is a p-type layer.

When the n-type GaN crystal is grown by a metal-organic vapor phase epitaxy (MOVPE method), normally a method of doping Si, with silane ($SiH_4$) and disilane ($Si_2H_6$) used as doping gas, is employed.

However, in the HVPE method suitable for high-speed growth, silane and disilane can not be used as doping gas. This is because since the HVPE method is a so-called hot wall type crystal growth system in which source gas is brought into contact with a reactor wall heated at high temperature, silane and disilane are decomposed before they reach the substrate and are not taken into crystal effectively.

Therefore, patent document 2 proposes a technique of doping Si by using dichlorosilane ($SiH_2Cl_2$) as doping gas, when the n-type nitride semiconductor crystal is grown by the HVPE method. Also, patent document 3 proposes a technique of manufacturing the GaN substrate with n-type conductivity by using oxygen as dopant.

(Patent document 1)
Japanese Patent Laid-Open Publication No. 2003-178984
(Patent document 2)
Japanese Patent Laid-Open Publication No. 2000-91234
(Patent document 3)
Japanese Patent Laid-Open Publication No. 2000-44400

However, as described above, since the GaN crystal is grown on the heterogeneous substrate, difference in coefficient of linear expansion is generated between the heterogeneous substrate and an initial GaN crystal layer at initial time of growth and difference of defect density is generated in a thickness direction of the GaN layer, thereby generating a stress in the GaN crystal, resulting in a warpage generated in the as-grown GaN substrate, and in some cases, the substrate can not withstand the stress and crack is generated. Further, since the warpageed GaN substrate is flattened, variation of off-angles occurs in the surface of the substrate. By these problems, conventionally, a device manufacture by using the GaN substrate is difficult.

SUMMARY OF THE INVENTION

An object of the present invention is to provide a group-III nitride semiconductor freestanding substrate and a manufacturing method of the same capable of reducing a warpage of the freestanding substrate and suppressing generation of a crack.

One of the aspects of the present invention provides a group-III nitride semiconductor freestanding substrate, wherein a carrier concentration of a peripheral part of a n-type group-III nitride semiconductor freestanding substrate is lower than the carrier concentration inside of the peripheral part.

Another aspect of the present invention provides a manufacturing method of a group-III nitride semiconductor freestanding substrate, including the steps of:

growing a group-III nitride semiconductor layer on a growth surface of the base substrate, by supplying required group-III source gas, nitrogen source gas, n-type dopant gas and carrier gas, onto the growth surface of the base substrate; and manufacturing the group-III nitride semiconductor freestanding substrate from the group-III nitride semiconductor layer obtained by removing the base substrate, wherein in the step of growing the group-III nitride semiconductor layer, flow of the group-III source gas, the nitrogen source gas, the n-type dopant and the carrier gas in the vicinity of the growth surface of the base substrate is adjusted, so that a carrier concentration of the peripheral part of the group-III nitride semiconductor layer is lower than the carrier concentration inside of the peripheral part.

DESCRIPTION OF PREFERRED
EMBODIMENTS OF THE INVENTION

An embodiment of a group-III nitride semiconductor freestanding substrate and a manufacturing method of the same according to the present invention will be described hereinafter.

The group-III nitride semiconductor freestanding substrate according to this embodiment is the group-III nitride semiconductor freestanding substrate composed of a n-type GaN-related semiconductor crystal, with carrier concentration of a peripheral part of a substrate set to be lower than the carrier concentration of inside thereof.

As a carrier concentration distribution of the group-III nitride semiconductor freestanding substrate, the following case can be given, for example. Namely, the carrier concentration is highest in a center part of a freestanding substrate and the carrier concentration becomes gradually lower toward the peripheral part (outer edge) from the center part of the freestanding substrate (in the cases of examples 1 and 2 as will be described later).

However, the carrier concentration distribution of the group-III nitride semiconductor freestanding substrate is not limited to the carrier concentration distribution in which the carrier concentration is gradually lower toward the peripheral part (outer edge) from the center part of the substrate. For example, in some of the carrier concentration distribution, the carrier concentration becomes highest in an intermediate part between the center part of the freestanding substrate and the peripheral part (outer edge), and the carrier concentration becomes lower toward the peripheral part (outer edge) from the intermediate part where this carrier concentration is highest(in a case of example 3 as will be described later). When the carrier concentration becomes highest at this intermediate part, the peripheral part of the group-III nitride semiconductor substrate, where the carrier concentration is lower, is a part/region of approximately 20 mm or more radius, in a case of the freestanding substrate of 2 inch (50.8 mm) diameter (see FIG. 6).

A n-type conductive substrate is used in the group-III nitride semiconductor freestanding substrate, for example, a GaN substrate used in manufacturing a light emitting element. Compression strain is caused in a nitride semiconductor crystal layer such as GaN including n-type dopant, and therefore by changing a dopant concentration distribution, namely carrier concentration distribution in the surface of the substrate, stress caused by the compression strain can be relaxed.

Therefore, in this embodiment, the carrier concentration distribution is set in such a manner that the carrier concentration of the peripheral part of the freestanding substrate is lower than the carrier concentration inside thereof. Whereby, the compression strain on the peripheral side of the substrate is reduced more than the compression strain on the center side of the freestanding substrate, thus relaxing the stress of the freestanding substrate and reducing a warpage of the freestanding substrate. By reducing the warpage of the freestanding substrate, generation of a crack can be significantly suppressed.

In this embodiment, the carrier concentration distribution of the group-III nitride semiconductor freestanding substrate is defined as a value $(C_{max}-C_{min})/C_{max}=\Delta\sigma$ ($\Delta\sigma$ is called a "maximum variation of the carrier concentration" hereinafter) obtained by dividing a difference $C_{max}-C_{min}$ between a maximum value $C_{max}$ of the carrier concentration and a minimum value $C_{min}$ of the carrier concentration in the surface of the substrate, by the maximum value $C_{max}$ of the carrier concentration.

Conventionally, the carrier concentration in the surface of the substrate is made uniform as much as possible, and when such uniformity is achieved, the maximum variation $\Delta\sigma$ of the carrier concentration is 0.05 or less. In the group-III nitride semiconductor freestanding substrate of this embodiment, the maximum variation $\Delta\sigma$ of the carrier concentration is set to be 0.05 or more, to thereby achieve reduction of the warpage of the substrate. In addition, preferably an upper limit of the maximum variation $\Delta\sigma$ of the carrier concentration is set to be, for example, 0.18 or less, as is shown in the example described later, and further the maximum variation $\Delta\sigma$ of the carrier concentration is preferably set to be in a range from 0.13 to 0.18.

In addition, the group-III nitride semiconductor freestanding substrate of this embodiment is doped with n-type dopant such as silicon and oxygen, to increase conductivity of the substrate, and in any one of the places in the surface of the substrate, the carrier concentration exceeds $5.0\times10^{17}$ cm$^{-3}$.

The freestanding substrate of the group-III nitride semiconductor has a strength enough to be handled, and preferably thickness of the substrate is set to be 200 μm or more, and a diameter of the substrate is set to be 2 inch (50.8 mm) or more.

Further, preferably the surface, being a main surface of the group-III nitride semiconductor freestanding substrate is any one of a C-face, M-face, or A-face.

The group-III nitride semiconductor freestanding substrate of the present invention also includes the freestanding substrate made of AlN, AlGaN, InN, and InGaN, other than the GaN freestanding substrate.

In the manufacture of the group-III nitride semiconductor freestanding substrate, first, the group-III nitride semiconductor layer, becoming the group-III nitride semiconductor freestanding substrate, is grown on a base substrate. Namely, the group-III nitride semiconductor layer is grown on a growth surface of the base substrate, by supplying required group-III source gas, nitrogen source gas, n-type dopant gas, and carrier gas, to the growth surface of the base substrate. HVPE method and MOVPE method, or the like is used in the growth of the group-III nitride semiconductor layer. In the HVPE method, fast growth of the group-III nitride semiconductor layer is possible, and this is a preferable method.

Next, required processing and machining such as flattening by polishing, cleaning, grounding of the outer peripheral part, and chamfering, or the like, is applied to the group-III nitride semiconductor layer obtained by removing the base substrate, to thereby manufacture the group-III nitride semiconductor freestanding substrate.

As a removing method of the base substrate, natural separation by VAS method (Void-Assisted Separation Method) and other methods such as etching and laser beam irradiation can be given. A heterogeneous substrate such as a sapphire substrate and a silicon substrate, or a homogeneous substrate such as a GaN substrate is used in the base substrate.

When the group-III nitride semiconductor layer is grown, the flow of the group-III source gas, nitrogen source gas, n-type dopant gas, and carrier gas in the vicinity of the growth surface of the base substrate is adjusted, so that the carrier concentration of the peripheral part of the group-III nitride semiconductor layer is lower than the carrier concentration inside of the peripheral part.

As a method of making the carrier concentration of the peripheral part of the group-III nitride semiconductor layer lower than the carrier concentration inside thereof, specifically the following method can be given.

(1) The base substrate is normally held by a substrate holder (jig). When the group-III nitride semiconductor layer is grown, an outer edge part of the base substrate is held by the substrate holder, to thereby adjust a thickness of a part of the substrate holder protruding from the growth surface of the base substrate in a growing direction of the group-III nitride semiconductor layer. Specifically, thickness is adjusted so as to be thicker than the thickness of a protruding portion of the substrate holder when the carrier concentration in the surface of the group-III nitride semiconductor layer is made uniform. Thus, the flow of the group-III source gas, nitrogen source gas, n-type dopant gas, and carrier gas in the vicinity of the growth surface of the base substrate is changed and adjusted, thus making a carrier concentration distribution in which the carrier concentration of the peripheral part of the group-III nitride semiconductor layer is lower than the carrier concentration inside of the peripheral part.

(2) When the group-III nitride semiconductor layer is grown, the outer edge part of the base substrate is held by the substrate holder, and the flow rate of purge gas flowing from a gap between the outer peripheral surface of the base substrate and the inner peripheral surface of the substrate holder is adjusted. Specifically, the flow rate of the purge gas is increased more than the flow rate of the purge gas when the carrier concentration in the surface of the group-III nitride semiconductor layer is made uniform. The purge gas functions, so that the grown group-III nitride semiconductor layer and the substrate holder are not fixed to each other in a stage of growth. However, by increasing the flow rate of the purge gas, the carrier concentration of the peripheral part of the group-III nitride semiconductor layer can be made low.

(3) When the group-III nitride semiconductor layer is grown, the flow rate of the carrier gas is adjusted. Specifically, the flow rate of the carrier gas is increased more than the flow rate of the carrier gas when the carrier concentration in the surface of the group-III nitride semiconductor layer is made uniform. Thus, the carrier concentration of the peripheral part of the group-III nitride semiconductor layer can be made low.

EXAMPLES

Next, examples of the present invention and comparative examples will be described.

In the examples of the present invention and the comparative examples, the GaN freestanding substrate of 2 inch diameter (50.8 mm) was manufactured by using VAS method (specifically, for example see the aforementioned patent document 1).

The VAS method is a method, in which a void formed GaN layer is provided between the sapphire substrate and the GaN thick film, becoming the GaN freestanding substrate, and the GaN thick film is separated at a boundary of the void formed GaN layer after end of the growth of the GaN thick film, and the VAS method has a characteristic that the GaN freestanding substrate can be easily manufactured.

In the examples and the comparative examples, first, a void formed substrate having the void formed GaN layer on the sapphire substrate was manufactured.

Specifically, an undoped GaN layer was grown on the sapphire substrate by MOVPE method, and a Ti thin film was deposited on this undoped GaN layer by vacuum vapor deposition. A substrate, on which the Ti thin film was vapor-deposited, was put into an electric furnace, and thermal treatment was applied thereto in an atmosphere of a mixed gas of ammonia gas and hydrogen gas. By this thermal treatment, a void formed substrate was obtained wherein the undoped GaN layer was set as the void formed GaN layer having a void of high density, and the Ti thin film was nitrided and set as pores formed TiN layer on which fine pores of sub-micron were formed in high density.

In the following examples and comparative examples, this void formed substrate was used as a starting substrate (base substrate) for growing the GaN thick film, becoming the GaN freestanding substrate.

Figure 1:
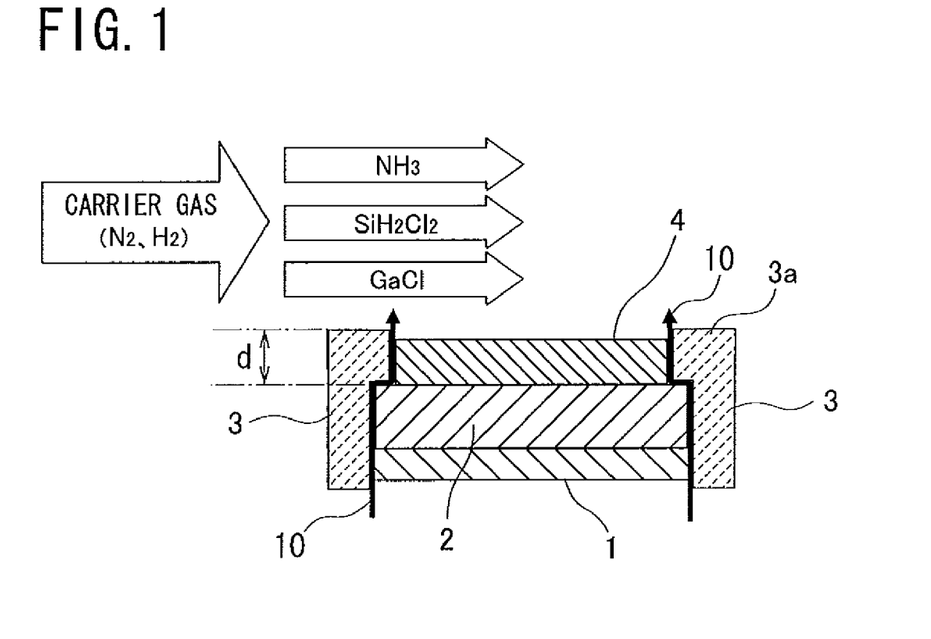
FIG. 1 is a side view showing a rough structure of a manufacturing method of growing a GaN layer according to examples and comparative examples.
Figure 2:
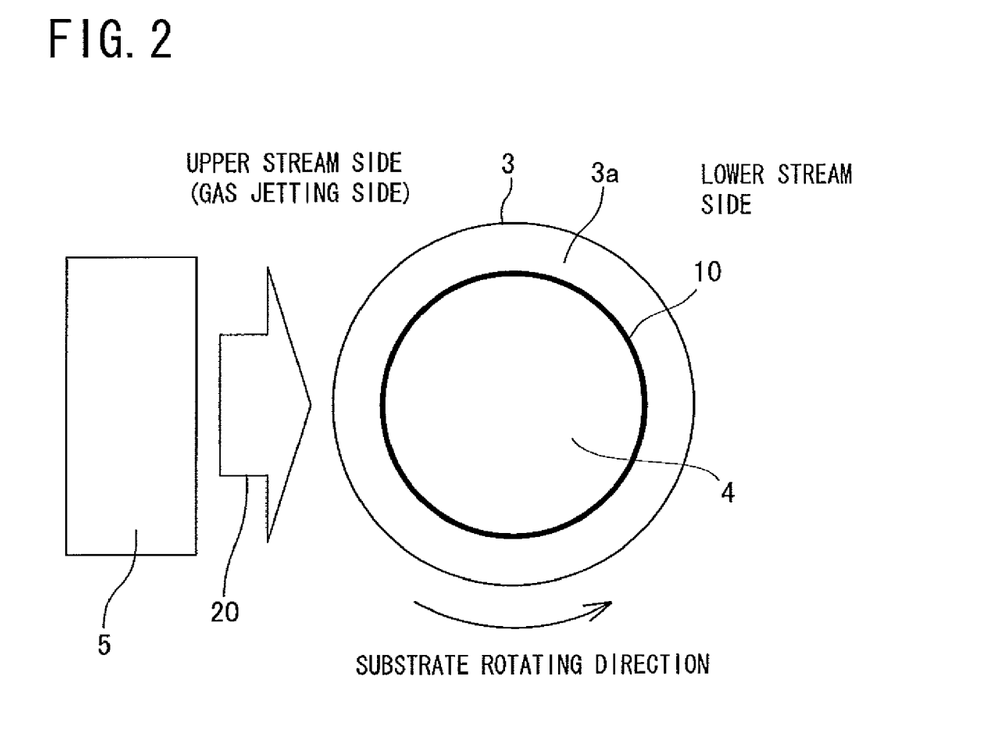
FIG. 2 is an upper side view showing the rough structure of the manufacturing method of growing the GaN layer according to the examples of the present invention and the comparative examples.

FIG. 1 is a side view showing a rough structure of a manufacturing method of growing the GaN layer according to the examples and the comparative examples, and FIG. 2 is an upper side view showing the rough structure of this manufacturing method.

As shown in FIG. 1 and FIG. 2, a void formed substrate 2, becoming the starting substrate (base substrate) is horizontally placed on a soaking plate 1 in a growing furnace (HVPE furnace). The GaN layer (GaN thick film) 4 is grown on the void formed substrate 2 by the HVPE method. The outer peripheral part and the upper outer edge part of the void formed substrate 2 are held by the substrate holder (jig) 3. Portion 3a of the substrate holder protruded to an upper side in a growing direction of the GaN layer 4 from the upper surface, being the growth surface of the void formed substrate 2 has a dimension of height (thickness) d from the upper surface of the void formed substrate 2. The void formed substrate 2 is driven by a rotation drive mechanism not shown, to rotate with prescribed number of rotations around a central axis of the void formed substrate 2. A source jetting port 5 for supplying mixed gas 20 of source gas and carrier gas onto the void formed substrate 2, is provided at an upper side of the void formed substrate 2. The mixed gas 20 of the source gas and the carrier gas is jetted from the source jetting port 5, and is horizontally flown from the left side (upper stream side) to the right side (lower stream side) in FIG. 1 and FIG. 2.

In these examples and comparative examples, GaCl (chloride gallium) was used as Ga source gas, $NH_3$ (ammonia gas) was used as nitrogen source gas, $SiH_2Cl_2$ (dichlorosilane) was used as Si dopant gas, and $N_2$ (nitrogen gas) and $H_2$ (hydrogen gas) were used as carrier gas.

Further, purge gas (holder purge gas) 10 is flown through a gap between the outer peripheral surface of the soaking plate 1 and the void formed substrate 2, and the inner peripheral surface of the substrate holder 3. The purge gas 10 is the gas for preventing fixation between the substrate holder 3 and the GaN layer 4 grown on the void formed substrate 2. However, in the example 2, this purge gas 10 further functions as the gas for changing a carrier concentration distribution of the GaN layer 4.

When the GaN layer 4 is grown on the void formed substrate 2, the void formed substrate 2 is heated to a prescribed temperature by a heater not shown from a lower side of the soaking plate 1, while the void formed substrate 2 is rotated around its central axis with prescribed number of rotations, and the mixed gas 20 of the source gas and the carrier gas is flown onto the void formed substrate 2, to thereby make the GaN layer 4 grown on the void formed substrate 2. In addition, when the GaN layer 4 is grown, the purge gas 10 of a prescribed flow rate is flown to the inner periphery side of the substrate holder 3.

Comparative Example 1

A growing condition for growing the GaN layer 4 in the comparative example 1 is based on the growing condition in the comparative example 2 and examples 1 to 3 as will be described next. In the comparative example 1, the undoped GaN layer 4 was grown. Accordingly, in the comparative example 1, $SiH_2Cl_2$ is not flown.

The growing condition of the comparative example 1 is as follows.

A growing temperature of the GaN layer 4 was set at 1050° C., supplied amount of source gas was set to be 100 cc for GaCl, 1000 CC for $NH_3$, and the flow rate of the carrier gas was set to be 6.9 slm (standard liter/min) for $N_2$, and set to be 2 slm for $H_2$, rotation of the substrate was set to be 20 rpm, gas flow rate of the purge gas 10 flown to the outer periphery of a growing part of the GaN layer 4 was set to be 1 slm. Then, the undoped GaN layer 4 was grown to 800 μm thickness. Moreover, the height (thickness) d of portion 3a of the substrate holder 3 holding the upper outer edge part of the void formed substrate 2 was set to be 1 mm.

The manufactured GaN layer 4 (GaN thick film) was separated from the void formed substrate 2, and the warpage of the as-grown GaN freestanding substrate composed of obtained GaN layer 4 was measured by a laser displacement meter. The backside of the GaN freestanding substrate was warpageed in a convex shape (the backside of the GaN freestanding substrate was also warpageed in a convex shape in the following comparative example 2 and examples 1 to 3).

Here, the warpage of the GaN substrate was defined as a vertical distance (height) from a flat surface to the backside of the GaN substrate, at a position of the outer edge part of the GaN substrate positioned radially 25 mm apart from the center position of the backside of the GaN substrate in contact with the flat surface, when the backside of the GaN substrate is placed on the flat surface, with the backside of the GaN substrate facing downward. A measurement result by the laser displacement meter showed that the warpage of the GaN freestanding substrate of comparative example 1 was 93 μm.

Further, the carrier concentration in the surface of the GaN freestanding substrate was measured by using a non-contact type resistivity measurement apparatus and a mobility measurement apparatus. The measurement of the carrier concentration of the GaN freestanding substrate was performed at a center point of the substrate (r=0 mm), and at five points (five points of r=5 mm, 10 mm, 15 mm, 20 mm, 25 mm) set apart at intervals of 5 mm radially from the center point.

The measured carrier concentration of the GaN freestanding substrate of comparative example 1 was respectively $5.25 \times 10^{17}$ cm$^{-3}$ at the center point (r=0 mm), $5.25 \times 10^{17}$ cm$^{-3}$, $5.20 \times 10^{17}$ cm$^{-3}$, $5.19 \times 10^{17}$ cm$^{-3}$, $5.09 \times 10^{17}$ cm$^{-3}$, $5.00 \times 10^{17}$ cm$^{-3}$ at each point of r=5 mm, 10 mm, 15 mm, 20 mm, 25 mm, respectively from the center point.

Further, generation of crack is recognized in the GaN freestanding substrate of comparative example 1.

Figure 5:
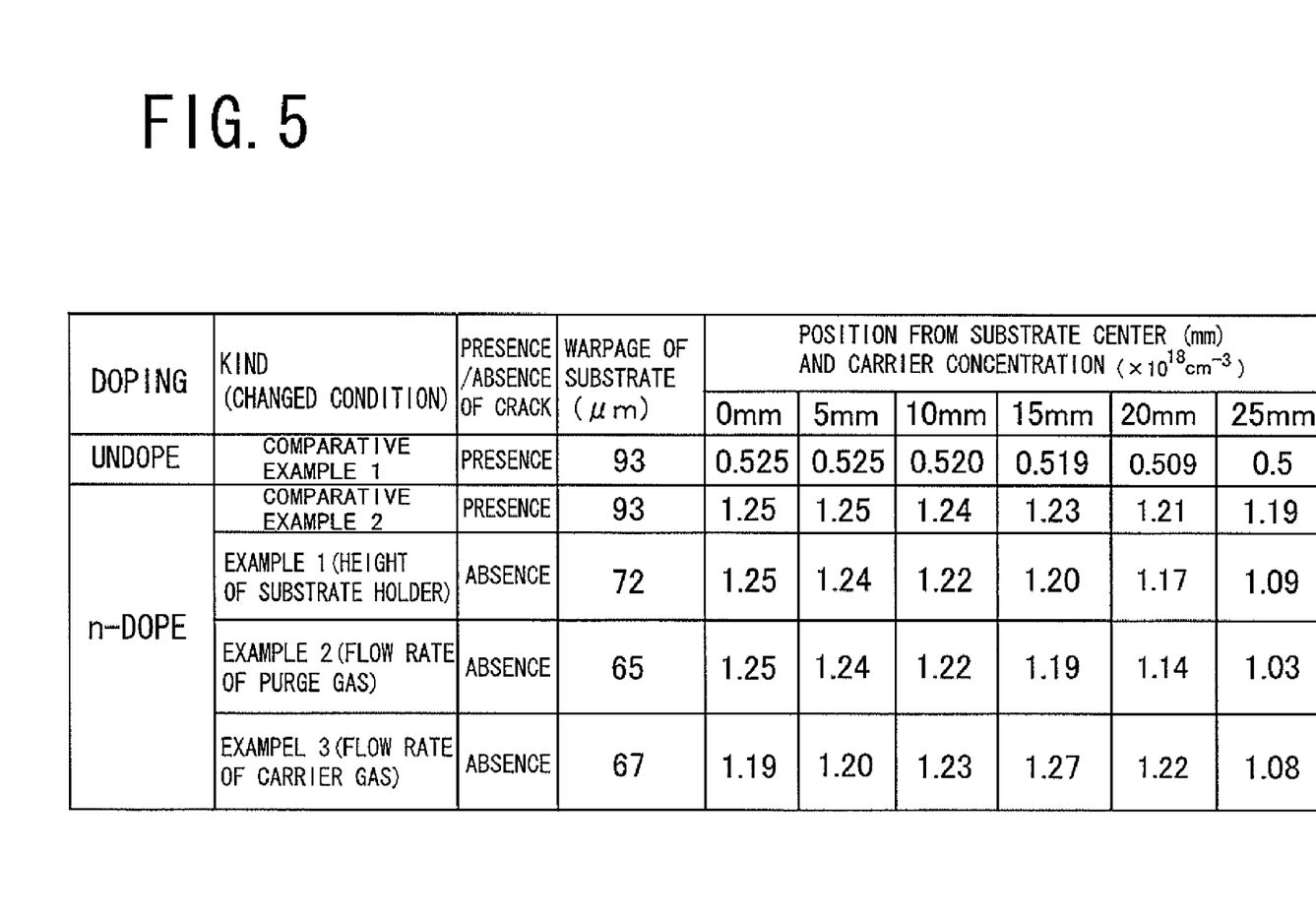
FIG. 5 is a view showing a relation between a distribution of the carrier concentration of the GaN substrate and presence/absence of warpage and crack of the substrate.
Figure 6:
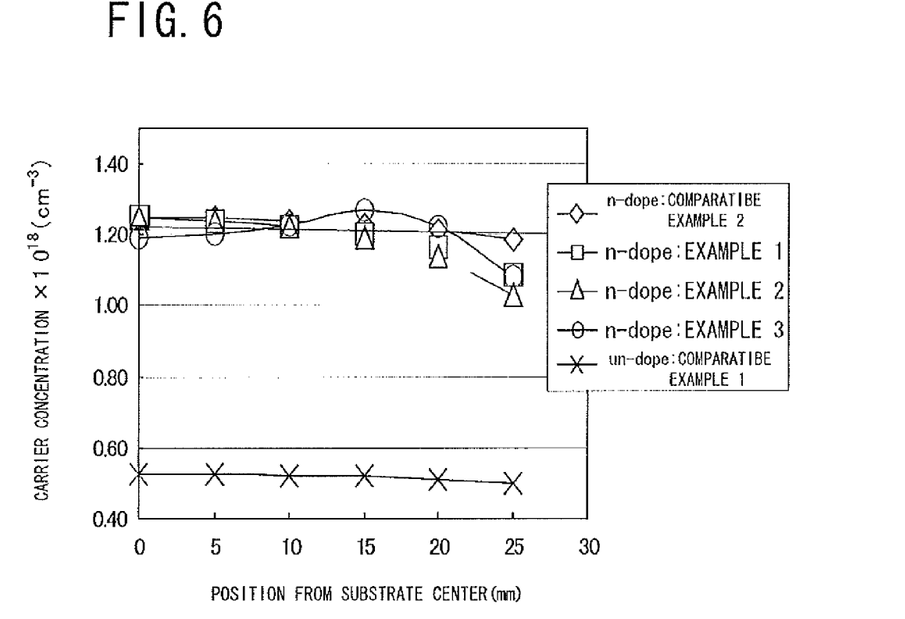
FIG. 6 is a graph showing the result of FIG. 5.

FIG. 5 shows the warpage, the carrier concentration at each point, and presence/absence of generation of crack of the GaN freestanding substrate of comparative example 1 (FIG. 5 also shows the warpage, the carrier concentration at each point, and presence/absence of crack of the GaN freestanding substrate of comparative example 2 and examples 1 to 3). Further, FIG. 6 shows a graph of the carrier concentration distribution of the measurement result.

Both surfaces of the aforementioned as-grown GaN freestanding substrate are flattened by polishing, and a side face of the freestanding substrate is machined into a further circular shape, to thereby obtain the GaN freestanding substrate having 2 inch diameter (50.8 mm) and 400 μm thickness.

Comparative Example 2

In comparative example 2, in addition to the growing conditions of the aforementioned comparative example 1, 20 cc of $SiH_2Cl_2$, being n-type dopant source gas, is supplied and GaN layer 4 of high carrier concentration is grown. In comparative example 2 also, in the same way as comparative example 1, the warpage of the GaN freestanding substrate obtained by separation, and the carrier concentration distribution were measured and the presence/absence of crack was examined. The result is shown in FIG. 5 and FIG. 6.

The warpage of the GaN freestanding substrate of comparative example 2 was 93 μm, which was the same as the warpage of the GaN freestanding substrate of comparative example 1, and the carrier concentration distribution was approximately uniform in the surface of the substrate. Also, the GaN freestanding substrate of comparative example 2 has cracks.

Example 1

In the example 1, height d of the substrate holder 3 was set to be 2 mm higher than 1 mm, namely, d=3 mm, under the growing condition of the comparative example 2. By setting height d of the substrate holder 3 high, the gas was hardly supplied to the peripheral part of a growing area of the GaN layer 4, and therefore it was possible to confirm a state in which the carrier concentration on the center part side and the peripheral side of the GaN layer 4 was changed.

In the example 1 also, in the same way as comparative example 1, the warpage of the GaN freestanding substrate obtained by separation and the carrier concentration distribution were measured and the presence/absence of crack was examined. The result is shown in FIG. 5 and FIG. 6.

In the carrier concentration distribution of the GaN freestanding substrate of example 1, the carrier concentration is highest in the center part of the GaN freestanding substrate, and the carrier concentration becomes gradually lower toward the periphery (outer edge) from the center part of the substrate. The warpage of the GaN freestanding substrate of example 1 was 72 μm, and the warpage was reduced by 21 μm compared with comparative examples 1 and 2. Further, there is no generation of crack.

Example 2

In example 2, the flow rate of the purge gas 10 was changed from 1 slm to 5 slm (the flow rate of the purge gas 10 was increased), under the growing conditions of comparative example 2.

The purge gas (holder purge gas) 10 functions, such that originally grown GaN layer 4 and the substrate holder 3 are not fixed to each other in the growing stage. However, a state such as hardly allowing the source to reach the void formed substrate 2 side is also possible by flowing the purge gas 10. By increasing the flow rate of the purge gas 10 of a growth peripheral part of the GaN layer 4 from 1 slm of comparative example 2 to 5 slm of this example, the flow speed of the purge gas 10 of the growth peripheral part becomes fast, and a state in which the GaN layer 4 is hardly grown is made. Therefore, the peripheral part shows the growth of lower carrier concentration than that of the center part of the GaN layer 4.

In example 2 also, in the same way as comparative example 1, the warpage of the GaN freestanding substrate obtained by separation and the carrier concentration distribution were measured, and the presence/absence of crack was examined. The result is shown in FIG. 5 and FIG. 6.

In the carrier concentration distribution of the GaN freestanding substrate of example 2, the carrier concentration was highest in the center part of the GaN freestanding substrate, and the carrier concentration became gradually lower toward the periphery (outer edge) from the center part of the substrate. The warpage of the GaN freestanding substrate of example 2 was 65 μm and the warpage was reduced by 28 μm compared with comparative examples 1 and 2, and no generation of crack was recognized.

Example 3

In example 3, the flow rate of the carrier gas was changed, under the growing conditions of comparative example 2. Namely, the flow rate condition of the carrier gas, in which $N_2$ was set to be 6.9 slm and $H_2$ was set to be 2 slm (called flow rate condition 1 hereinafter) was changed to the flow rate condition of the carrier gas, in which $N_2$ was set to be 9.9 slm and $H_2$ was set to be 2 slm (called flow rate condition 2 hereinafter), to thereby increase the flow rate of the carrier gas. By changing the flow rate of the carrier gas in the source gas, reaction points of $NH_3$, GaCl, and $SiH_2Cl_2$, being the source gas, can be changed.

In FIG. 1 and FIG. 2, a static test was conducted without rotating the substrate (the number of rotations of the substrate is 0 rpm), and the distribution of a growing thickness of the GaN layer was examined. The growing conditions were the same as those of comparative example 2 (the flow rate of the carrier gas was set under flow rate condition 1), excluding a point that the substrate was not rotated, and one-hour growth was carried out. Since this is the static test, it is possible to confirm at which part the source is reacted. Also, the flow rate of the carrier gas was set as defined by the flow rate condition 2, and similarly the static test was conducted, to thereby examine the distribution of the growth thickness of the GaN layer.

Figure 3:
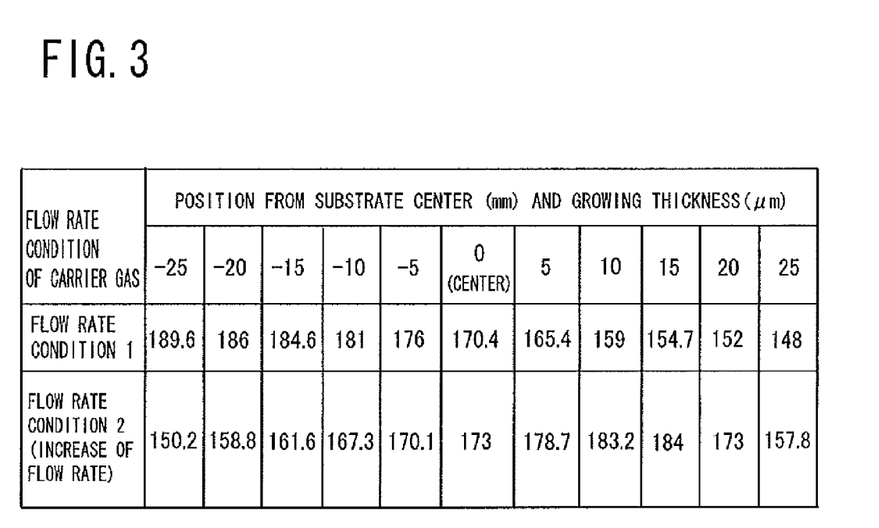
FIG. 3 is a view showing a GaN film thickness grown at each position on a static substrate, when a flow rate of carrier gas is varied.

FIG. 3 shows the thickness of the GaN layer grown at each point on the static substrate, under the flow rate conditions 1 and 2. Also, FIG. 4 shows the graph of the result of FIG. 3.

Figure 4:
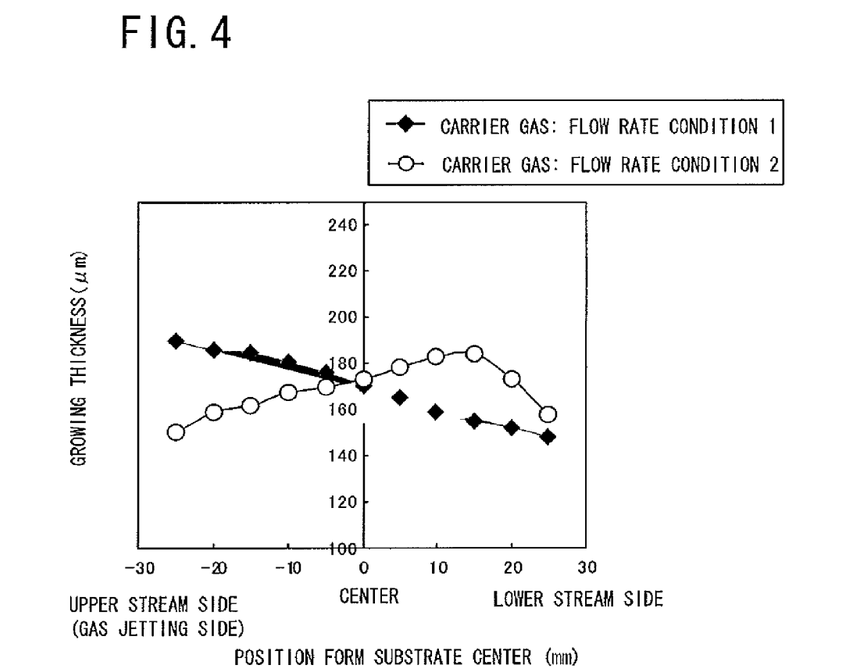
FIG. 4 is a graph showing a result of FIG. 3.

From the results of FIG. 3 and FIG. 4, it is found that the thickness becomes gradually smaller from an end portion of the substrate holder 3 on the source supply side, under the flow rate condition 1 of the carrier gas. Namely, it can be so estimated that the point where the source is reacted most is the end portion of the substrate holder 3, or the source supply side of the outer periphery of the substrate holder 3.

Also, under the flow rate condition 2 of increasing the flow rate of the carrier gas, thickest part is a position of +15 mm from the center (r=0 mm) of the substrate (position of 15 mm in a direction of the lower stream side of the mixed gas 20 from the center of the substrate), which is the point where reaction occurs vigorously.

In example 3, the flow rate of the carrier gas was changed to the flow rate defined by flow rate condition 2, in the growth condition of the comparative example 2.

In example 3 also, in the same way as comparative example 1, the warpage of the GaN freestanding substrate obtained by separation and the carrier concentration distribution were measured and the presence/absence of crack was examined. The result is shown in FIG. 5 and FIG. 6.

In the carrier concentration distribution of the GaN freestanding substrate of example 3, the carrier concentration was loosely increased to the vicinity of r=15 mm from the center of the substrate, and was decreased on the peripheral side. The warpage of the GaN freestanding substrate of example 3 was 67 μm, and the warpage was reduced by 26 μm compared with comparative examples 1 and 2, and no generation of crack was recognized.

Figure 7:
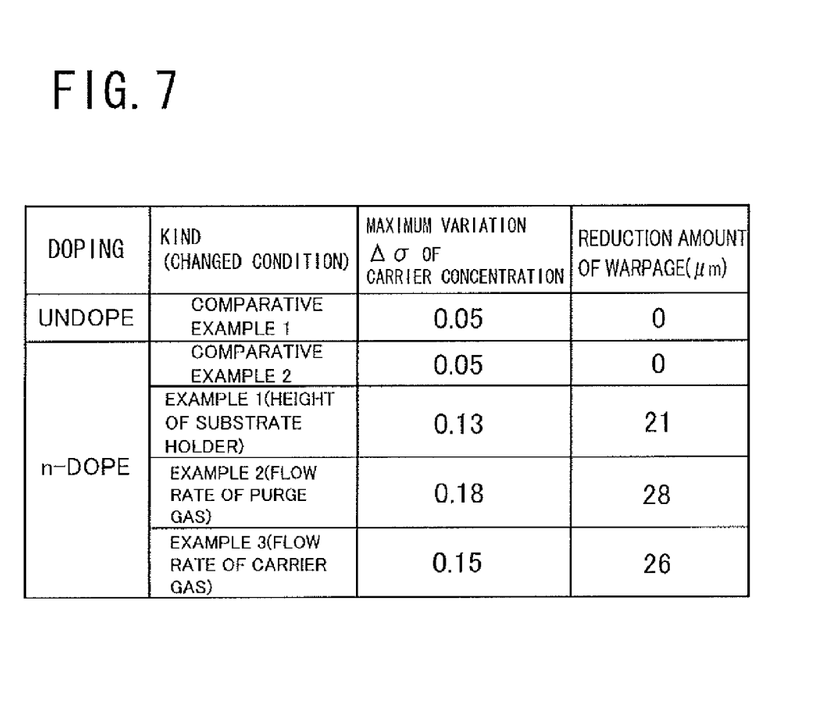
FIG. 7 is a view showing a relation between a maximum variation $\Delta\sigma$ of the carrier concentration of the GaN substrate and a variation of a warpage of a substrate.

From the results of the comparative example and the example shown in FIG. 5 and FIG. 6, the relation between the maximum variation Δσ of the carrier concentration of the GaN freestanding substrate and the variation (reduction amount) of the warpage of the substrate is shown in FIG. 7. Moreover, the result of FIG. 7 is arranged into a graph and shown in FIG. 8.

Figure 8:
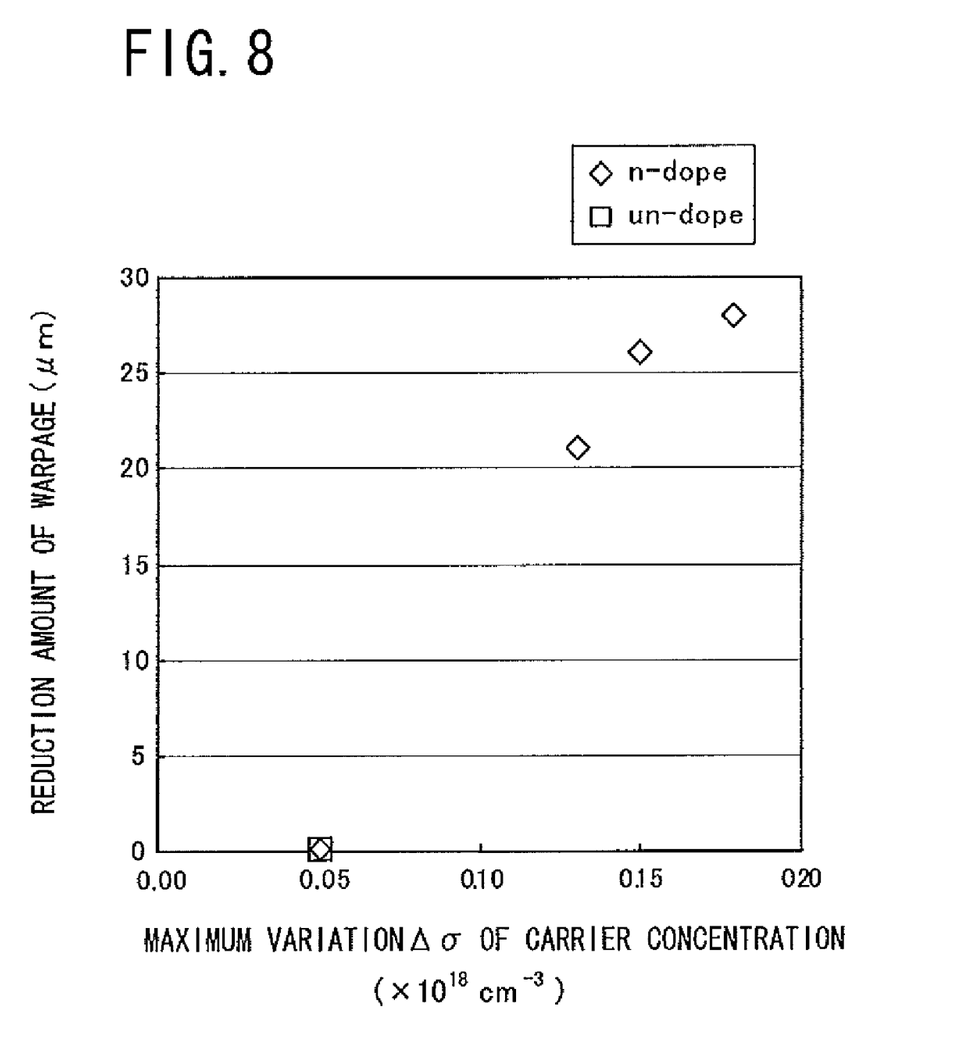
FIG. 8 is a graph showing the result of FIG. 7.

As shown in FIG. 7 and FIG. 8, in comparative examples 1 and 2, the maximum variation Δσ of the carrier concentration was 0.05, thereby showing a uniform carrier concentration distribution, and even in the GaN freestanding substrate of comparative example 2 doped with Si, the warpage same as the warpage of the GaN freestanding substrate of comparative example 1 was generated and crack was also generated.

Meanwhile, in the GaN freestanding substrate of examples 1 to 3, the carrier concentration of the peripheral part of the substrate was lower than the carrier concentration inside thereof, and the maximum variation Δσ of the carrier concentration was 0.13 to 0.18, and the warpage of the GaN freestanding substrate of examples 1 to 3 was more greatly reduced than the warpage (93 μm) of comparative examples 1 and 2. Further, from the results shown in FIG. 7 and FIG. 8, it is found that when the maximum variation Δσ of the carrier concentration of the GaN freestanding substrate is greater than 0.05, the generation of crack can be suppressed. Also, when the maximum variation Δσ of the carrier concentration is 0.18 (in a case of example 2), the warpage of the substrate is reduced by 28 μm. In addition, it is found that even when the point of high carrier concentration is deviated from the center part of the substrate (in a case of example 3), the warpage of the substrate can be greatly reduced.

The aforementioned example shows the GaN growth by using the sapphire substrate, being the heterogeneous substrate. However, even in the growth of the GaN thick film carried out from a GaN single crystal, the carrier concentration in the surface of the GaN thick film is changed by the growing conditions such as growing temperature, supply amount of gas, and flow rate of gas, to thereby change the stress of the GaN freestanding substrate. Whereby, the generation of crack can be prevented and reduction of the warpage of the freestanding substrate can be realized.

What is claimed is:
1. A group-III nitride semiconductor freestanding substrate, with carrier concentration of a peripheral part of a n-type group-III nitride semiconductor freestanding substrate set to be lower than the carrier concentration inside of the peripheral part.

2. The group-III nitride semiconductor freestanding substrate according to claim 1, wherein value Δσ obtained by dividing a difference between a maximum value of the carrier concentration and a minimum value of the carrier concentration in a surface of the freestanding substrate by the maximum value of the carrier concentration is greater than 0.05, and the carrier concentration in any place in the surface of the freestanding substrate exceeds $5.0 \times 10^{17}$ cm$^{-3}$.

3. The group-III nitride semiconductor freestanding substrate according to claim 2, wherein the value Δσ is 0.18 or less.

4. The group-III nitride semiconductor freestanding substrate according to claim 2, wherein the value Δσ is 0.13 or more and 0.18 or less.

5. The group-III nitride semiconductor freestanding substrate according to claim 1, wherein a main surface of the group-III nitride semiconductor freestanding substrate is any one of C-face, M-face, or A-face.

6. The group-III nitride semiconductor freestanding substrate according to claim 1, wherein the carrier concentration is decreased gradually toward the peripheral part from a center part of the group-III nitride semiconductor substrate.

7. The group-III nitride semiconductor freestanding substrate according to claim 1, wherein the carrier concentration is highest in an intermediate part between a center part and the peripheral part of the group-III nitride semiconductor freestanding substrate, and the carrier concentration is decreased from the intermediate part to the peripheral part.

8. The group-III nitride semiconductor freestanding substrate according to claim 1, wherein the group-III nitride semiconductor freestanding substrate is a GaN substrate.

9. The group-III nitride semiconductor freestanding substrate according to claim 1, wherein n-type dopant of the group-III nitride semiconductor freestanding substrate is Si.

10. The group-III nitride semiconductor freestanding substrate according to claim 1, wherein the group-III nitride semiconductor freestanding substrate has a thickness of 200 μm or more, and a diameter of 2 inch or more.

* * * * *